United States Patent
Hodono (10) Patent No.: US 7,907,803 B2
(45) Date of Patent: Mar. 15, 2011

(54) MANUFACTURING METHOD OF OPTO-ELECTRIC HYBRID MODULE AND OPTO-ELECTRIC HYBRID MODULE OBTAINED THEREBY

(75) Inventor: Masayuki Hodono, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 12/754,905

(22) Filed: Apr. 6, 2010

(65) Prior Publication Data

US 2010/0254666 A1    Oct. 7, 2010

Related U.S. Application Data

(60) Provisional application No. 61/171,211, filed on Apr. 21, 2009.

(30) Foreign Application Priority Data

Apr. 6, 2009    (JP) .................................. 2009-092139

(51) Int. Cl.
G02B 6/10      (2006.01)
G02B 6/12      (2006.01)
G02B 6/36      (2006.01)
H05K 3/30      (2006.01)
B32B 37/12     (2006.01)

(52) U.S. Cl. .............. 385/14; 385/88; 385/147; 29/832; 156/305; 372/102

(58) Field of Classification Search ............. 385/14, 385/49–52, 88, 129, 131, 141; 156/305; 29/832; 372/102; 428/429, 411.1; 438/31, 438/42, 43, 32, 930; 264/1.28
See application file for complete search history.

(56) References Cited

U.S. PATENT DOCUMENTS

| | | | |
|---|---|---|---|
| 5,319,725 A | 6/1994 | Buchmann et al. | |
| 2003/0219208 A1* | 11/2003 | Kwon et al. | 385/49 |
| 2004/0234210 A1 | 11/2004 | Nagasaka et al. | |
| 2005/0185892 A1* | 8/2005 | Kwon et al. | 385/49 |
| 2005/0207718 A1 | 9/2005 | Komura et al. | |
| 2007/0297713 A1 | 12/2007 | Lu et al. | |
| 2009/0016670 A1* | 1/2009 | Shemi et al. | 385/14 |
| 2009/0279827 A1* | 11/2009 | Sano et al. | 385/14 |
| 2009/0285580 A1* | 11/2009 | Yasuda et al. | 398/139 |
| 2010/0254666 A1* | 10/2010 | Hodono | 385/88 |

FOREIGN PATENT DOCUMENTS

| | | |
|---|---|---|
| EP | 0548440 A1 | 6/1993 |
| JP | 2004-302345 A | 10/2004 |
| WO | 2009/001969 A2 | 12/2008 |

OTHER PUBLICATIONS

European Search Report dated Jul. 13, 2010, issued in corresponding European Patent Application No. 10159096.

* cited by examiner

Primary Examiner — Akm E Ullah
(74) Attorney, Agent, or Firm — Westerman, Hattori, Daniels & Adrian, LLP (57) ABSTRACT

A manufacturing method of an opto-electric hybrid module which is capable of suppressing losses in cost, and an opto-electric hybrid module obtained thereby. An optical waveguide portion $W_1$ including protrusions 4 for the positioning of an electric circuit portion $E_1$, and the electric circuit portion $E_1$ including through holes 8 for fitting engagement with the protrusions 4 are produced individually. An optical element 11 is mounted on the electric circuit portion $E_1$. Thereafter, an inspection is performed to verify the mounting state of the optical element 11. When the appropriate mounting is verified, the through holes 8 in the electric circuit portion $E_1$ are brought into fitting engagement with the protrusions 4 for the positioning of the electric circuit portion $E_1$, whereby the electric circuit portion $E_1$ with the optical element 11 mounted thereon and the optical waveguide portion $W_1$ are integrated with each.

3 Claims, 9 Drawing Sheets

PRIOR ART

MANUFACTURING METHOD OF OPTO-ELECTRIC HYBRID MODULE AND OPTO-ELECTRIC HYBRID MODULE OBTAINED THEREBY

RELATED APPLICATIONS

This application claims the benefit of U.S. Provisional Application No. 61/171,211, filed Apr. 21, 2009, which is hereby incorporated by reference.

BACKGROUND OF THE INVENTION

1. Field of the Invention

The present invention relates to a manufacturing method of an opto-electric hybrid module including an optical waveguide portion, an electric circuit portion, and an optical element mounted on this electric circuit portion, and to an opto-electric hybrid module obtained thereby.

2. Description of the Related Art

Figure 10:
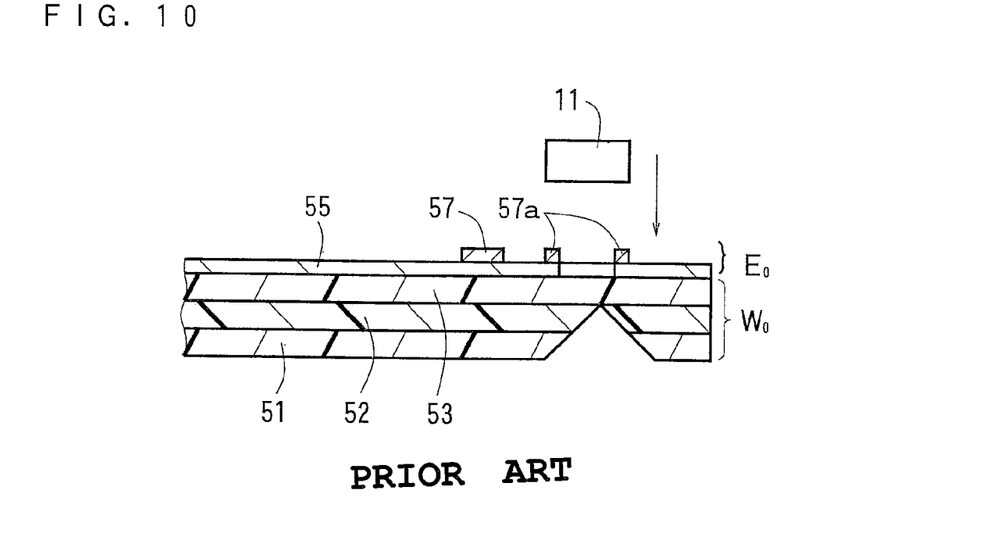
FIG. 10 is an illustration schematically showing a conventional manufacturing method of an opto-electric hybrid module.

As shown in FIG. 10, a conventional opto-electric hybrid module is manufactured by: individually producing an optical waveguide portion $W_O$ in which an under cladding layer 51, a core 52 and an over cladding layer 53 are disposed in the order named and an electric circuit portion $E_O$ in which an electric circuit 57 (including pads 57a for the mounting of an optical element 11) is formed on a substrate 55; bonding the back surface of the substrate 55 in the above-mentioned electric circuit portion $E_O$ to the front surface of the over cladding layer 53 in the optical waveguide portion $W_O$ with an adhesive (not shown); and thereafter mounting the optical element 11 on the pads 57a for the mounting of the optical element 11 which are included in the electric circuit 57 in the above-mentioned electric circuit portion $E_O$ (see, for example, Japanese Patent Application Laid-Open No. 2004-302345). When the optical waveguide portion $W_O$ and the electric circuit portion $E_O$ are bonded to each other and thereafter the optical element 11 is mounted on the electric circuit portion $E_O$ by using the above-mentioned pads 57a for the mounting of the optical element 11 as a guide in this manner, it is easy to locate the optical element 11 in an appropriate position relative to the core 52 in the optical waveguide portion $W_O$. For this reason, it is common practice to mount the optical element 11 after the optical waveguide portion $W_O$ and the electric circuit portion $E_O$ are bonded to each other.

After the mounting of the above-mentioned optical element 11, a burn-in step [the process of subjecting the optical element 11 to harsher conditions (for example, high temperature and high voltage) than normal use conditions] is performed. Thereafter, an inspection is performed to verify the mounting state of the above-mentioned optical element 11. As a result of this inspection, an opto-electric hybrid module in which the mounting state of the optical element 11 is appropriate (an accepted product) is shipped as a finished product, and an opto-electric hybrid module in which the mounting state of the optical element 11 is not appropriate (a reject) is discarded.

DISCLOSURE OF THE INVENTION

When the manufacture of the above-mentioned opto-electric hybrid module is achieved by bonding the optical waveguide portion $W_O$ and the electric circuit portion $E_O$ to each other and thereafter mounting the optical element 11 on the electric circuit portion $E_O$ as in the above-mentioned prior art, the entire opto-electric hybrid module is discarded if the opto-electric hybrid module is judged to be a reject as a result of the mounting inspection of the above-mentioned optical element 11. A material for the formation of the above-mentioned optical waveguide portion $W_O$ is very expensive. Discarding the optical waveguide portion $W_O$ results insignificant losses. Conventionally, however, such losses are overlooked because greater importance is placed on the mounting of the optical element 11 in the appropriate position.

In view of the foregoing, it is an object of the present invention to provide a manufacturing method of an opto-electric hybrid module which is capable of suppressing losses in cost, and an opto-electric hybrid module obtained thereby.

To accomplish the above-mentioned object, a first aspect of the present invention is intended for a method of manufacturing an opto-electric hybrid module including an optical waveguide portion, an electric circuit portion, and an optical element mounted on the electric circuit portion, wherein the production of said optical waveguide portion comprises: forming a linear core for an optical path on a surface of an under cladding layer; and then forming protrusions for the positioning of the electric circuit portion in a predetermined appropriate position by a die-molding process at the same time as forming an over cladding layer for covering said core, wherein the production of said electric circuit portion comprises: forming an electric circuit including pads for the mounting of the optical element on a substrate; and forming through holes for fitting engagement with the protrusions for the positioning of said electric circuit portion, wherein, after the optical element is mounted on the pads in said electric circuit portion for the mounting of the optical element, an inspection is performed to verify the mounting state of the optical element, and wherein, when the appropriate mounting is verified, said through holes in said electric circuit portion are brought into fitting engagement with the protrusions for the positioning of said electric circuit portion, whereby the electric circuit portion with the optical element mounted thereon and the optical waveguide portion are integrated with each other into the opto-electric hybrid module.

A second aspect of the present invention is intended for an opto-electric hybrid module comprising: an optical waveguide portion; an electric circuit portion; and an optical element mounted on the electric circuit portion, said optical waveguide portion including an under cladding layer, a linear core for an optical path and formed on a surface of the under cladding layer, an over cladding layer for covering the core, and protrusions for the positioning of the electric circuit portion and formed on the over cladding layer, said electric circuit portion including a substrate, an electric circuit including pads for the mounting of the optical element and formed on the substrate, and through holes for fitting engagement with the protrusions for the positioning of said electric circuit portion, said optical element being an accepted product as a result of an appropriate mounting inspection performed, with said optical element mounted on the pads for the mounting of said optical element, said through holes in said electric circuit portion being brought into fitting engagement with the protrusions in said optical waveguide portion for the positioning of said electric circuit portion, whereby the electric circuit portion with the optical element mounted thereon and the optical waveguide portion are integrated with each other into the opto-electric hybrid module.

In the manufacturing method of the opto-electric hybrid module according to the present invention, the step of producing the optical waveguide portion comprises forming the protrusions for the positioning of the electric circuit portion in an appropriate position, and the step of producing the electric circuit portion comprises forming the through holes for fitting engagement with the protrusions for the positioning of above-mentioned electric circuit portion. After the optical element is mounted on the electric circuit portion, the inspection is performed to verify the mounting state of the optical element. Only the electric circuit portion judged to be an accepted product (electric circuit portion with the optical element mounted thereon judged to be an accepted product) in which the appropriate mounting of the optical element is verified as a result of the inspection is used to manufacture the opto-electric hybrid module by bringing the above-mentioned through holes into fitting engagement with the above-mentioned protrusions in the optical waveguide portion. This prevents the electric circuit portion with the optical element mounted thereon judged to be a reject as a result of the above-mentioned inspection from being assembled to the optical waveguide portion and hence causing the entire opto-electric hybrid module to become a defective. As a result, significant cost reduction is achieved. Also, in the manufacturing method of the opto-electric hybrid module according to the present invention, as described above, the above-mentioned through holes in the electric circuit portion are brought into fitting engagement with the above-mentioned protrusions for in the optical waveguide portion, whereby the electric circuit portion with the optical element mounted thereon and the optical waveguide portion are integrated with each other into the opto-electric hybrid module. This facilitates the appropriate positioning of the above-mentioned optical element and the optical waveguide portion relative to each other during the integration.

In particular, when the protrusions for the positioning of the above-mentioned electric circuit portion are located in an appropriate position relative to an end portion of the above-mentioned core and the through holes for fitting engagement with the protrusions are located in an appropriate position relative to the pads for the mounting of the optical element, then the end portion of the above-mentioned core and the optical element are located more appropriately by integrating the electric circuit portion wherein the optical element is mounted on the pads for the mounting of the optical element and the above-mentioned optical waveguide portion with each other.

Further, when the substrate of the above-mentioned electric circuit portion is made of metal, and the step of producing the above-mentioned electric circuit portion comprises the steps of: forming an insulation layer on a surface of the metal substrate, and then forming circuits for the positioning of the through holes around future through hole portions where the above-mentioned through holes are to be formed at the same time as forming the electric circuit including the pads for the mounting of the above-mentioned optical element; etching away portions of the above-mentioned metal substrate corresponding to the above-mentioned future through hole portions and etching away portions of the insulation layer corresponding to the above-mentioned future through hole portions by using the circuits for the positioning of the through holes as a reference, to thereby form the above-mentioned through holes; and performing a plating process for mounting on surfaces of the electric circuit except the pads for the mounting of the above-mentioned optical element and the circuits for the positioning of the through holes, then the use of the circuits for the positioning of the above-mentioned through holes enables the position in which the through holes for fitting engagement with the protrusions for the positioning of the above-mentioned electric circuit portion will be formed to be located in a more appropriate position. Additionally, the above-mentioned substrate is made of metal. This allows the removal of the portions of the above-mentioned metal substrate corresponding to the future through hole portions by etching with higher accuracy. In the light of these facts, the end portion of the above-mentioned core and the optical element are located much more appropriately. Further, the above-mentioned plating process for mounting performed on the surfaces of the electric circuit except the pads for the mounting of the above-mentioned optical element and the circuits for the positioning of the through holes improves the antirust effect of the above-mentioned electric circuit and the like.

The opto-electric hybrid module according to the present invention is such that the through holes in the electric circuit portion are brought into fitting engagement with the protrusions in the optical waveguide portion for the positioning of the electric circuit portion, whereby the electric circuit portion with the optical element mounted thereon and the optical waveguide portion are integrated with each other. Thus, the above-mentioned optical element and the optical waveguide portion are located appropriately relative to each other. The optical element mounted on the pads in the electric circuit portion for the mounting of the optical element is an accepted product as a result of the appropriate mounting inspection. Thus, the opto-electric hybrid module according to the present invention ensures the propagation of light.

In particular, when the protrusions for the positioning of the above-mentioned electric circuit portion are located in an appropriate position relative to an end portion of the above-mentioned core and the through holes for fitting engagement with the protrusions are located in an appropriate position relative to the pads for the mounting of the optical element, then the end portion of the above-mentioned core and the optical element are located more appropriately. Thus, light propagation efficiency is improved.

Further, when the substrate of the above-mentioned electric circuit portion is made of metal, when the electric circuit including the pads for the mounting of the above-mentioned optical element, and circuits for the positioning of the through holes are formed on a surface of the metal substrate, with an insulation layer therebetween, and when a plated layer obtained by a plating process for mounting is formed on surfaces of the electric circuit except the pads for the mounting of the above-mentioned optical element and the circuits for the positioning of the through holes, then the through holes for fitting engagement with the protrusions for the positioning of the above-mentioned electric circuit portion are located and formed in a more appropriate position by using the circuits for the positioning of the above-mentioned through holes. Thus, the end portion of the above-mentioned core and the optical element are located much more appropriately, and the light propagation efficiency is further improved. Further, the plated layer formed on the surfaces of the electric circuit except the pads for the mounting of the above-mentioned optical element and the circuits for the positioning of the through holes prevents the above-mentioned electric circuit and the like from rusting.

DETAILED DESCRIPTION OF THE INVENTION

Next, embodiments according to the present invention will now be described in detail with reference to the drawings.

Figure 1A:
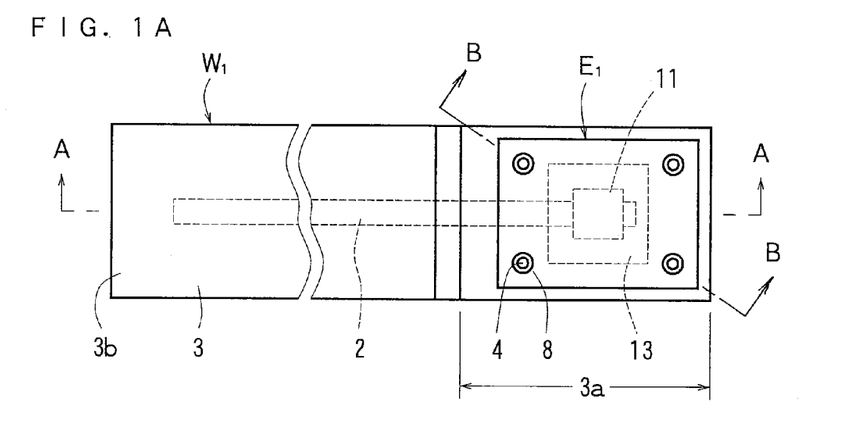
FIG. 1A is a plan view schematically showing an opto-electric hybrid module according to an embodiment of the present invention.
Figure 1B:
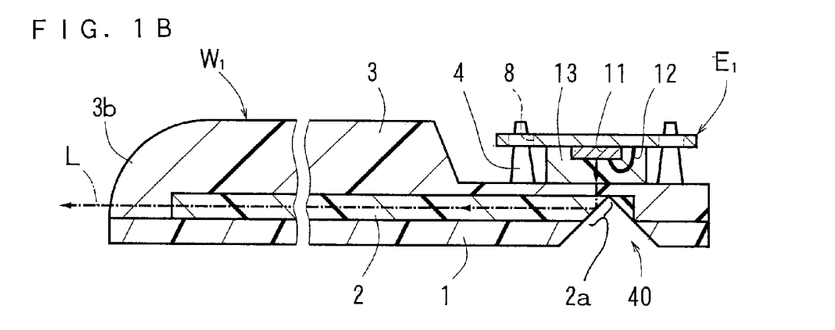
FIG. 1B is a sectional view taken along the line A-A of FIG. 1A.

FIG. 1A is a plan view schematically showing an opto-electric hybrid module according to one embodiment of the present invention, and FIG. 1B is a sectional view taken along the line A-A of FIG. 1A. This opto-electric hybrid module is constructed in a manner to be described below. An optical waveguide portion $W_1$ having protrusions 4 for the positioning of an electric circuit portion $E_1$ and the electric circuit portion $E_1$ having through holes 8 for fitting engagement with the protrusions 4 are produced individually, and an optical element 11 is mounted on the electric circuit portion $E_1$. Thereafter, an inspection is performed to verify the mounting state of the optical element 11. Then, only an accepted product (electric circuit portion with the optical element mounted thereon judged to be an accepted product) in which the appropriate mounting of the optical element 11 is verified is integrated with the optical waveguide portion $W_1$ by bringing the through holes 8 into fitting engagement with the protrusions 4.

More specifically, the above-mentioned optical waveguide portion $W_1$ includes an under cladding layer 1, a linear core 2 for an optical path formed in a predetermined pattern on a surface of this under cladding layer 1, an over cladding layer 3 formed on the surface of the above-mentioned under cladding layer 1 so as to cover this core 2, and the four protrusions 4 for the positioning of the electric circuit portion $E_1$ and formed on a portion of the above-mentioned over cladding layer 3 corresponding to a first end portion of the above-mentioned core 2. These protrusions 4 are located in an appropriate position relative to the first end portion of the above-mentioned core 2. Further, each of the protrusions 4 is formed in a frusto-conical shape according to this embodiment. Also, the first end portion of the above-mentioned core 2 and a portion of the under cladding layer 1 corresponding thereto are formed with a notch 40 of an inverted V shape, as shown. A first side surface of the inverted V-shaped notch 40 on the core 2 side is formed as an inclined surface inclined at 45 degrees to the axial direction of the above-mentioned core 2, and an end portion of the core 2 lying at the inclined surface serves as a light reflecting surface $2a$. The light reflecting surface $2a$ is located and formed under the above-mentioned optical element 11. Also, according to this embodiment, a first end portion $3a$ of the over cladding layer 3 on which the above-mentioned protrusions 4 are formed is of a reduced thickness to ensure space for the assembling of the electric circuit portion $E_1$, and a second end portion of the over cladding layer 3 is formed as a substantially quadrantal lens portion $3b$ having an outwardly bulging surface.

Figure 2:
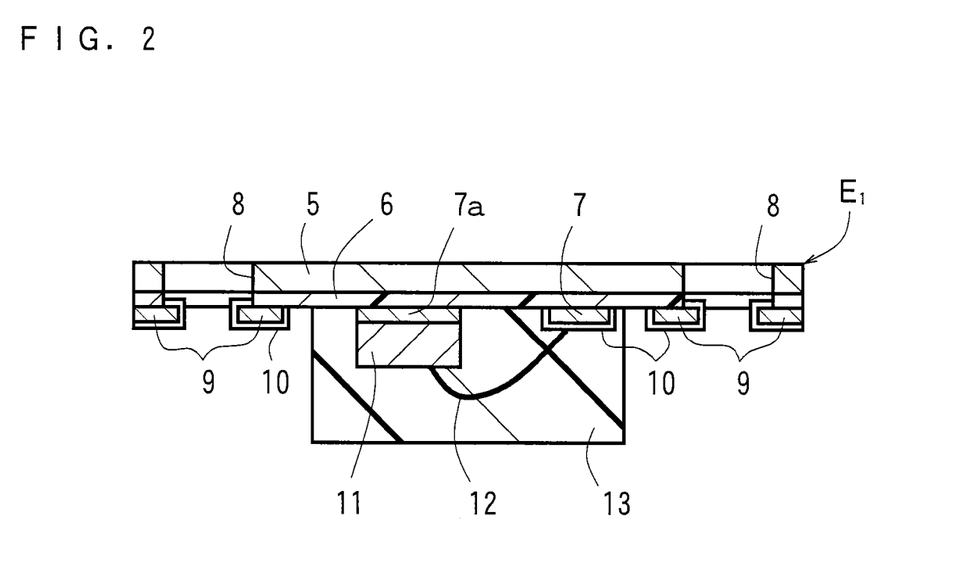
FIG. 2 is an enlarged view of a section of an electric circuit portion with an optical element mounted thereon, the section being taken along the line B-B of FIG. 1A.

As shown in FIG. 2 which is a sectional view (taken along the line B-B of FIG. 1A) on an enlarged scale, the above-mentioned electric circuit portion $E_1$ includes a rectangular stainless steel substrate 5, an insulation layer 6 formed on the lower surface of this stainless steel substrate 5, an electric circuit 7 formed on the lower surface of this insulation layer 6 and including pads $7a$ for the mounting of the optical element 11, and the four through holes 8 (with reference to FIG. 1A) for fitting engagement with the protrusions 4 for the positioning of the above-mentioned electric circuit portion $E_1$. These through holes 8 are formed in four corner portions of the above-mentioned rectangle (with reference to FIG. 1A). Also, according to this embodiment, circuits 9 for the positioning of the through holes 8 are formed on portions of the lower surface of the above-mentioned insulation layer 6 around the above-mentioned through holes 8. The circuits 9 for the positioning of the through holes 8 are used as a guide during the positioning and formation of the above-mentioned through holes 8. Further, a plated layer 10 obtained by a plating process for mounting is formed on the surface of the electric circuit 7 except the above-mentioned pads $7a$ for the mounting of the optical element 11 and on the surfaces of the circuits 9 for the positioning of the through holes 8.

The above-mentioned optical element 11 used in this embodiment is an element of a wire bonding type. Thus, the mounting of the above-mentioned optical element 11 is achieved by electrically connecting an electrode (cathode) provided on the upper surface of the optical element 11 through a hardening layer (not shown) of silver paste to the lower surfaces of the above-mentioned pads $7a$ for the mounting of the optical element 11 and electrically connecting an electrode (anode) provided on the lower surface of the above-mentioned optical element 11 through a bonding wire 12 to a second bonding pad of the above-mentioned electric circuit 7. In the above-mentioned mounting state, the above-mentioned optical element 11 and its surrounding portion are sealed with a transparent resin 13 by potting. The above-mentioned optical element 11 includes a light-emitting portion and a light-receiving portion both formed on the lower surface of the optical element 11.

As shown in FIGS. 1A and 1B, the above-mentioned opto-electric hybrid module according to the present invention is configured such that the through holes 8 in the above-mentioned electric circuit portion $E_1$ are in fitting engagement with the protrusions 4 in the above-mentioned optical waveguide portion $W_1$ for the positioning of the electric circuit portion $E_1$, whereby the electric circuit portion $E_1$ with the optical element 11 mounted thereon and the optical waveguide portion $W_1$ are integrated together. The optical element 11 in the above-mentioned opto-electric hybrid module is that having passed the above-mentioned mounting inspection. In this embodiment, the above-mentioned optical element 11 is disposed, with the lower surface side thereof (on which the light-emitting portion and the light-receiving portion are formed) positioned to face toward the core 2 of the optical waveguide portion $W_1$ (to face downward as seen in FIG. 1B).

In the above-mentioned opto-electric hybrid module, light L is propagated in a manner to be described below. Specifically, when the above-mentioned optical element 11 is, for example, a light-emitting element, the light L emitted downwardly from the light-emitting portion of the optical element 11 passes through the over cladding layer 3, and thereafter enters the first end portion of the core 2. Then, the light L is reflected from the light reflecting surface 2a provided in the first end portion of the above-mentioned core 2, and travels through the interior of the core 2 in an axial direction. Then, the light L exits from the an end surface provided in a second end portion of the core 2. Thereafter, the light L exits from the lens surface of the lens portion 3b provided in the second end portion of the over cladding layer 3, with the divergence of the light L restrained by refraction through the lens portion 3b.

On the other hand, when the above-mentioned optical element 11 is a light-receiving element, light travels in a direction opposite from that described above, although not shown. Specifically, the light enters the lens surface of the lens portion 3b provided in the second end portion of the over cladding layer 3, and enters the core 2 through the end surface provided in the second end portion of the above-mentioned core 2, while being narrowed down and converged by refraction through the lens portion 3b. Then, the light travels through the interior of the core 2 in an axial direction, and is reflected upwardly from the light reflecting surface 2a provided in the first end portion of the core 2. The light passes through and exits from the over cladding layer 3, and thereafter is received by the light-receiving portion of the above-mentioned optical element 11.

The above-mentioned opto-electric hybrid module according to the present invention may be used as a detection means for detecting a finger touch position and the like on a touch panel. Specifically, a plurality of light-emitting elements each corresponding to the above-mentioned optical element 11 (a light-emitting side) are arranged on a first side of a peripheral portion of a display screen of a rectangular display of the touch panel, and a plurality of light-receiving elements each corresponding to the above-mentioned optical element 11 (a light-receiving side) are arranged on a second side of the peripheral portion of the display screen of the above-mentioned display. At this time, the lens surfaces of the above-mentioned opto-electric hybrid module are arranged along the periphery of the display screen of the above-mentioned display, so that light beams emitted from the light-emitting side are received by the light-receiving side. This allows a plurality of light beams from the light-emitting side to travel in parallel with the display screen and in a lattice form on the display screen of the display. When a portion of the display screen of the display is touched with a finger, the finger blocks some of the emitted light beams. Thus, the light-receiving side senses a light blocked portion, whereby the position of the above-mentioned portion touched with the finger is detected.

The above-mentioned opto-electric hybrid module according to the present invention is manufactured by undergoing the process steps (1) to (4) to be described below. Of FIGS. 3A to 3C, 4A to 4C, 5A to 5E, 6A, 6B and 7 showing the manufacturing steps thereof, FIGS. 5A to 5E and FIGS. 6A and 6B are enlarged views of a portion corresponding to a section taken along the line B-B of FIG. 1A, and the remaining figures are sectional views of a portion corresponding to a section taken along the line A-A of FIG. 1A.

(1) The step of producing the above-mentioned optical waveguide portion $W_1$ (with reference to FIGS. 3A to 3C, and FIGS. 4A to 4C).

(2) The step of producing the above-mentioned electric circuit portion $E_1$ (with reference to FIGS. 5A to 5E).

Figure 6A:
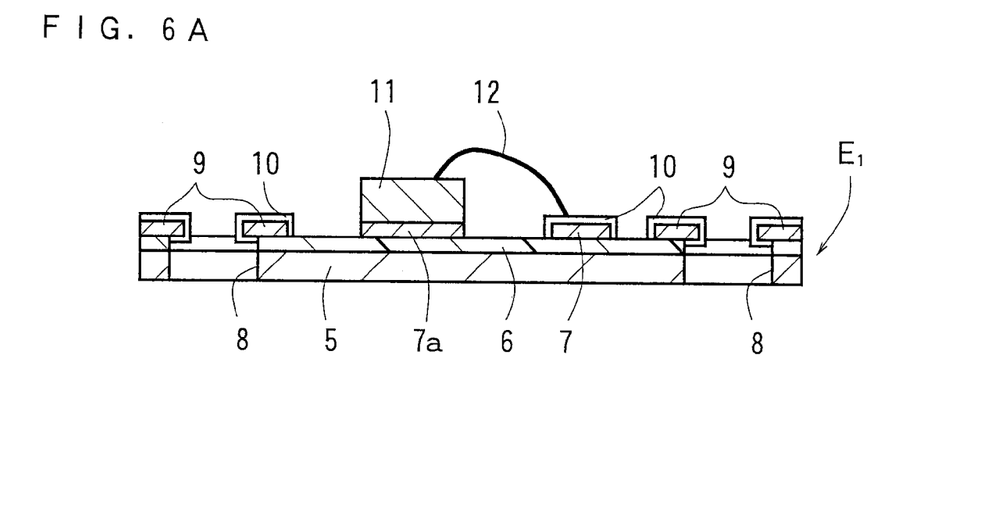
FIG. 6A is an illustration on an enlarged scale schematically showing the step of mounting the optical element in the manufacturing method of the opto-electric hybrid module.
Figure 6B:
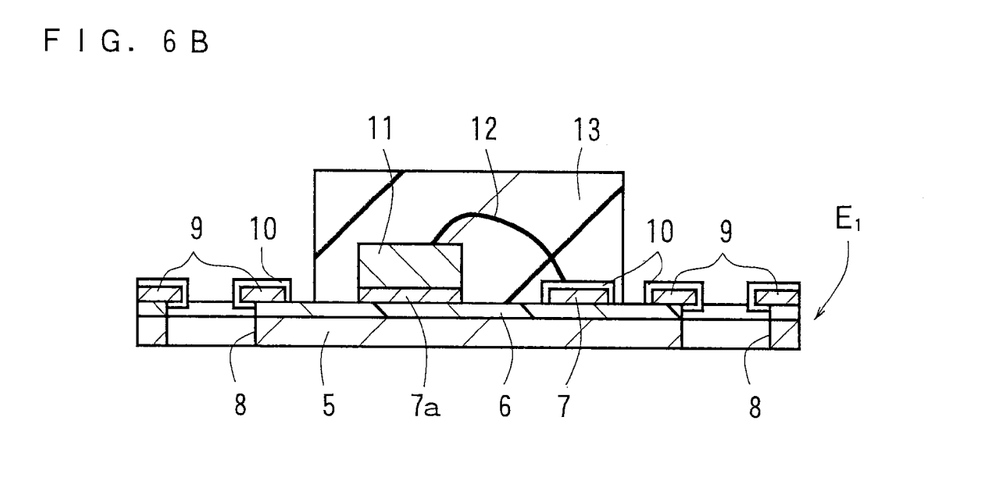
FIG. 6B is an illustration on an enlarged scale schematically showing the step of sealing the optical element with resin in the manufacturing method.

(3) The step of mounting the optical element 11 onto the above-mentioned electric circuit portion $E_1$ and thereafter performing the inspection to verify the mounting state of the optical element 11 (with reference to FIGS. 6A and 6B).

Figure 7:
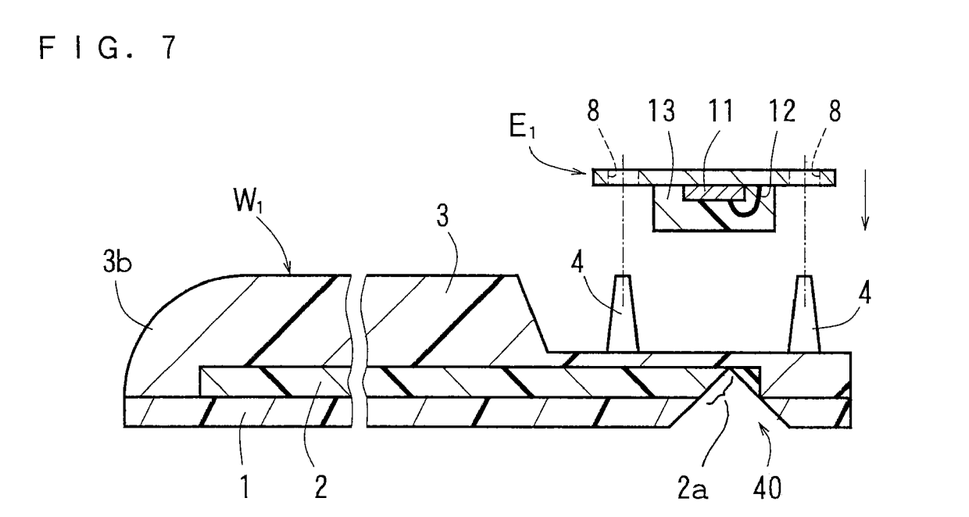
FIG. 7 is an illustration schematically showing the step of assembling the above-mentioned electric circuit portion to the above-mentioned optical waveguide portion.

(4) The step of assembling only the electric circuit portion $E_1$ judged to be an accepted product in which the appropriate mounting is verified as a result of the above-mentioned inspection to the above-mentioned optical waveguide portion $W_1$ (with reference to FIG. 7).

The above-mentioned step (1) of producing the optical waveguide portion $W_1$ will be described. First, a base 20 of a flat shape (with reference to FIG. 3A) for use in the formation of the under cladding layer 1 is prepared. Examples of a material for the formation of the base 20 include glass, quartz, silicon, resin, metal and the like. The thickness of the base 20 is, for example, in the range of 20 µm to 5 mm.

Figure 3A:
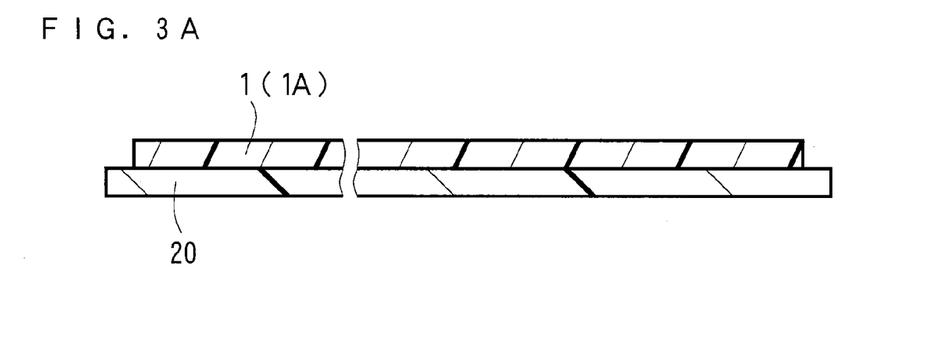
FIG. 3A is an illustration schematically showing the step of forming an under cladding layer in an optical waveguide portion in a manufacturing method of the opto-electric hybrid module.

Then, as shown in FIG. 3A, a varnish prepared by dissolving a photosensitive resin for the formation of the under cladding layer 1 such as a photosensitive epoxy resin and the like in a solvent is applied to a predetermined region of the surface of the above-mentioned base 20. Thereafter, a heating treatment (at 50 to 120° C. for approximately 10 to 30 minutes) is performed, as required, to dry the varnish, thereby forming a photosensitive resin layer 1A for the formation of the under cladding layer 1. Then, the photosensitive resin layer 1A is exposed to irradiation light such as ultraviolet light and the like. This causes the photosensitive resin layer 1A to be formed into the under cladding layer 1. The thickness of the under cladding layer 1 is typically in the range of 1 to 50 µm.

Figure 3B:
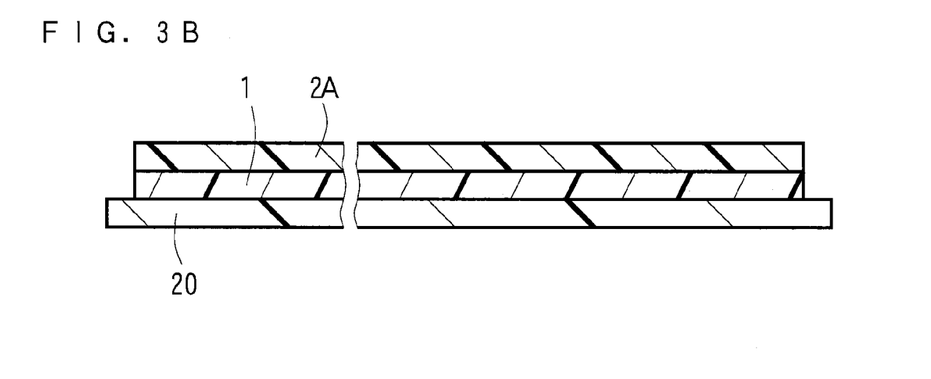
FIGS. 3B and 3C are illustrations schematically showing the step of forming a core in the manufacturing method.
Figure 3C:
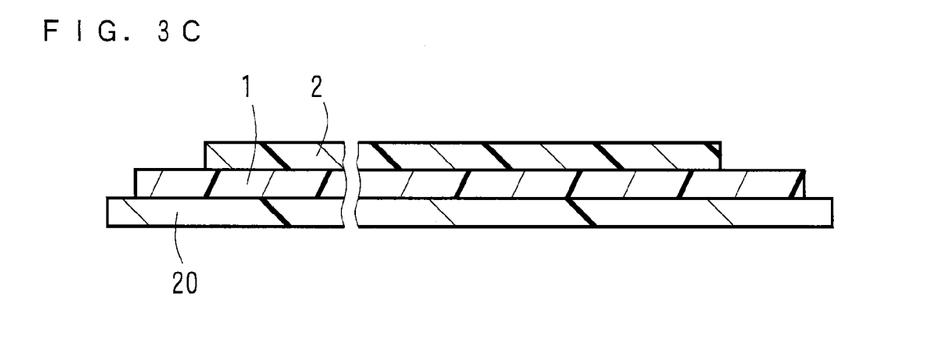

Next, as shown in FIG. 3B, a photosensitive resin layer 2A for the formation of the core 2 is formed on the surface of the above-mentioned under cladding layer 1 in a manner similar to the process for forming the photosensitive resin layer 1A for the formation of the above-mentioned under cladding layer 1. Then, the above-mentioned photosensitive resin layer 2A is exposed to irradiation light through a photomask formed with an opening pattern corresponding to the pattern of the core 2. Next, a heating treatment is performed. Thereafter, development is performed using a developing solution to dissolve away unexposed portions of the above-mentioned photosensitive resin layer 2A, as shown in FIG. 3C, thereby forming the remaining photosensitive resin layer 2A into the pattern of the core 2. The thickness (height) of the core 2 is typically in the range of 5 to 60 µm. The width of the core 2 is typically in the range of 5 to 60 µm.

Figure 4A:
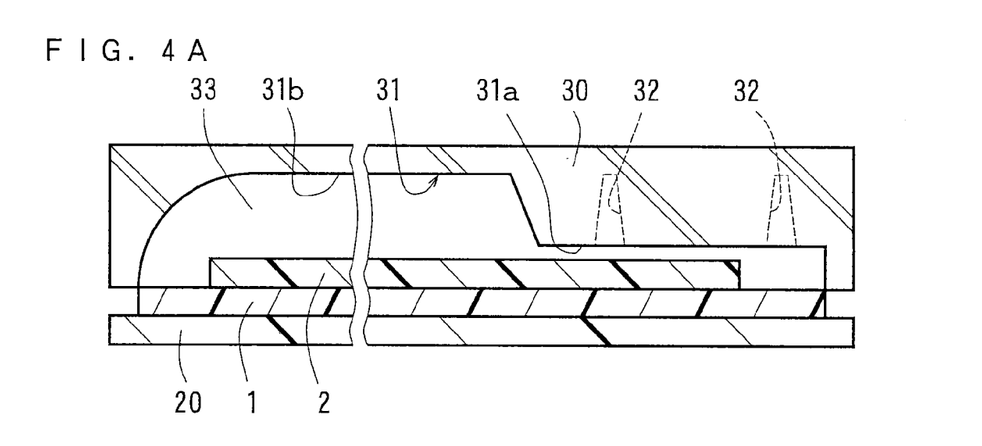
FIGS. 4A and 4B are illustrations schematically showing the step of forming an over cladding layer in the optical waveguide portion.
Figure 4B:
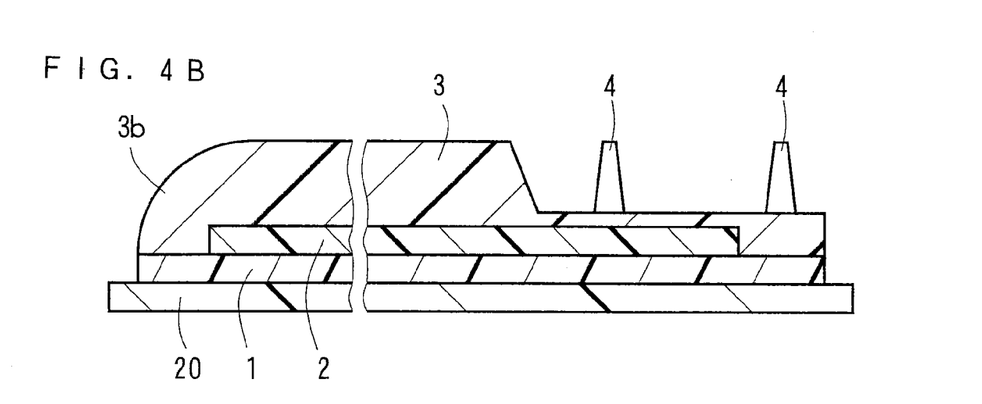

A material for the formation of the above-mentioned core 2 includes, for example, a photosensitive resin similar to that of the above-mentioned under cladding layer 1, and the material used herein has a refractive index greater than that of the material for the formation of the above-mentioned under cladding layer 1 and the over cladding layer 3 to be described below (with reference to FIG. 4B). The adjustment of this refractive index may be made, for example, by adjusting the selection of the types of the materials for the formation of the above-mentioned under cladding layer 1, the core 2 and the over cladding layer 3, and the composition ratio thereof.

Next, a molding die 30 (with reference to FIG. 4A) for use in die-molding the over cladding layer 3 (with reference to FIG. 4B) and the protrusions 4 for the positioning of the electric circuit portion $E_1$ (with reference to FIG. 4B) at the same time is prepared. The lower surface of this molding die 30 is formed with a recessed portion 31 having a die surface complementary in shape to the above-mentioned over cladding layer 3. This recessed portion 31 includes a portion 31a for the assembling of the electric circuit portion $E_1$ (with reference to FIG. 1B), and a portion 31b for the formation of the lens portion 3b (with reference to FIG. 4B). Indentations 32 complementary in shape to the above-mentioned protrusions 4 for the positioning of the electric circuit portion $E_1$ are formed in the portion 31a of the above-mentioned recessed portion 31 for the assembling of the electric circuit portion $E_1$. Also, the upper surface of the above-mentioned molding die 30 is formed with alignment marks (not shown) for the purpose of aligning with an end surface provided in the first end portion (the right-hand end surface as seen in FIG. 4A) of the core 2 to appropriately locate the molding die 30 when in use. The above-mentioned recessed portion 31 and the indentations 32 are formed in predetermined appropriate positions with respect to the alignment marks.

Specifically, the above-mentioned molding die 30 is set by using the above-mentioned alignment marks as a reference, and the molding is performed in that state. This allows the die-molding of the over cladding layer 3 and the protrusions 4 for the positioning of the electric circuit portion $E_1$ at the same time in predetermined appropriate positions with respect to the end surface provided in the first end portion of the core 2. Also, the above-mentioned molding die 30 is set by bringing the lower surface of the molding die 30 into intimate contact with the surface of the under cladding layer 1, whereby the space surrounded by the die surfaces of the above-mentioned recessed portion 31 and the indentations 32, the surface of the under cladding layer 1 and the surface of the core 2 is defined as a mold space 33. Further, the above-mentioned molding die 30 is further formed with an inlet (not shown) for the injection of a photosensitive resin for the formation of the over cladding layer 3 and the protrusions 4 for the positioning of the electric circuit portion $E_1$ therethrough into the above-mentioned mold space 33, the inlet being in communication with the above-mentioned recessed portion 31 and the indentations 32. Also, it is necessary that the photosensitive resin for the formation of the over cladding layer 3 which fills the above-mentioned mold space 33 be exposed to irradiation light such as ultraviolet light and the like directed through the above-mentioned molding die 30. For this reason, a molding die made of a material permeable to the irradiation light (for example, a molding die made of quartz) is used as the above-mentioned molding die 30.

Then, as shown in FIG. 4A, the above-mentioned alignment marks of the molding die 30 are aligned with the end surface provided in the first end portion of the above-mentioned core 2 so that the entire molding die 30 is appropriately located. In this state, the lower surface of the molding die 30 is brought into intimate contact with the surface of the under cladding layer 1. Then, the photosensitive resin for the formation of the over cladding layer 3 and the protrusions 4 for the positioning of the electric circuit portion $E_1$ is injected through the inlet formed in the above-mentioned molding die 30 into the mold space 33 surrounded by the die surfaces of the above-mentioned recessed portion 31 and the indentations 32, the surface of the under cladding layer 1 and the surface of the core 2 to fill the above-mentioned mold space 33 therewith. Next, exposure to irradiation light such as ultraviolet light is performed through the above-mentioned molding die 30, and thereafter a heating treatment is performed. This hardens the above-mentioned photosensitive resin to form the over cladding layer 3 and the protrusions 4 for the positioning of the electric circuit portion $E_1$ at the same time. Then, the molding die 30 is removed. As shown in FIG. 4B, the over cladding layer 3 and the protrusions 4 for the positioning of the electric circuit portion $E_1$ are provided. The protrusions 4 for the positioning of the electric circuit portion $E_1$ are located in the predetermined appropriate position relative to the end surface provided in the first end portion of the core 2 because the protrusions 4 are formed with respect to the end surface provided in the first end portion of the core 2 by using the above-mentioned molding die 30, as mentioned earlier. Also, the lens portion 3b of the above-mentioned over cladding layer 3 is also located in an appropriate position The thickness of the above-mentioned over cladding layer 3 (the thickness as measured from the surface of the under cladding layer 1) is as follows: the thickness of a thin portion thereof on the first end side (the right-hand side as seen in the figure) of the core 2 is greater than the thickness of the core 2 and is not greater than 150 μm; and the thickness of a thick portion thereof on the second end side (the left-hand side as seen in the figure) of the core 2 is greater than the thickness of the core 2 and is not greater than 1200 μm. Also, each of the above-mentioned protrusions 4 for the positioning of the electric circuit portion $E_1$ is formed in a frusto-conical shape having a height in the range of 500 to 1200 μm, a lower base with a diameter in the range of 800 to 3000 μm, and an upper base with a diameter in the range of 500 to 2000 μm. The formation of the above-mentioned protrusions 4 for the positioning of the electric circuit portion $E_1$ in a frusto-conical shape as mentioned above allows the above-mentioned protrusions 4 and the through holes 8 to come into coaxially fitting engagement with each other even if the outside diameter of the above-mentioned protrusions 4 and the inside diameter of the above-mentioned through holes 8 deviate from their design values during the fitting engagement of the through holes 8 in the electric circuit portion $E_1$ with the protrusions 4 in a later step. This prevents misregistration between the optical waveguide portion $W_1$ and the electric circuit portion $E_1$ along a plane perpendicular to the axes thereof.

An example of the material for the formation of the above-mentioned over cladding layer 3 used herein includes a photosensitive resin similar to that of the above-mentioned under cladding layer 1. The viscosity of the photosensitive resin is preferably in the range of 100 to 2000 mPa·s so as to enable the photosensitive resin to be injected into the above-mentioned mold space 33.

Figure 4C:
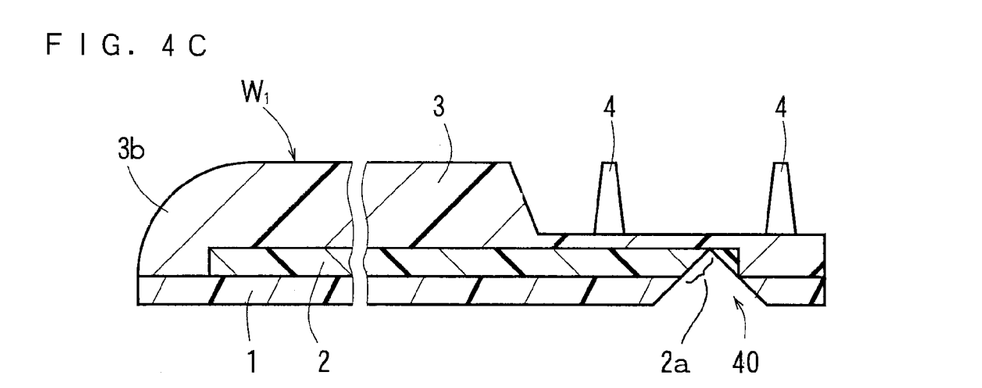
FIG. 4C is an illustration schematically showing the step of forming a light reflecting surface in an end portion of the core.

Then, the base 20 is stripped from the back surface of the under cladding layer 1. Thereafter, a dicing blade including a V-shaped edge having an included angle of 90 degrees or the like is used to cut the first end portion of the core 2 from the back surface side of the under cladding layer 1, thereby forming the notch 40 of an inverted V shape in a portion corresponding to the first end portion of the core 2, as shown in FIG. 4C. This causes the portion of the core 2 of the inverted V shape to be formed into the light reflecting surface 2a inclined at 45 degrees. This light reflecting surface 2a is formed under the optical element 11 to be mounted in a later step. In this manner, the above-mentioned step (1) of producing the optical waveguide portion $W_1$ is completed.

Next, the above-mentioned step (2) of producing the electric circuit portion $E_1$ will be described. First, the rectangular stainless steel substrate 5 (with reference to FIG. 5A) is prepared. The dimensions of this stainless steel substrate 5 are, for example, as follows: a vertical dimension in the range of 10 to 40 mm; a horizontal dimension in the range of 20 to 40 mm; and a thickness in the range of 0.04 to 0.2 mm.

Figure 5A:
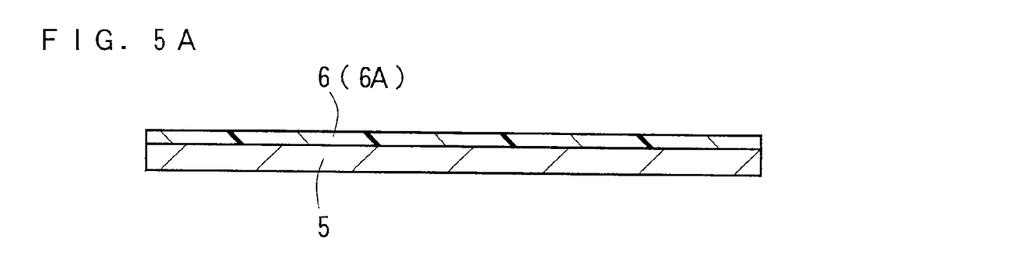
FIGS. 5A to 5E are illustrations on an enlarged scale schematically showing the step of producing the electric circuit portion in the manufacturing method of the above-mentioned opto-electric hybrid module.

Then, as shown in FIG. 5A, a varnish prepared by dissolving a photosensitive resin for the formation of the insulation layer 6 such as a photosensitive polyimide resin and the like in a solvent is applied to the entire surface of the above-mentioned stainless steel substrate 5. Thereafter, a heating treatment is performed, as required, to dry the varnish, thereby forming a photosensitive resin layer 6A for the formation of the insulation layer 6. Then, the photosensitive resin layer 6A is exposed to irradiation light such as ultraviolet light and the like. This causes the photosensitive resin layer 6A to be formed into the insulation layer 6. The thickness of the insulation layer 6 is typically in the range of 5 to 15 μm.

Figure 5B:
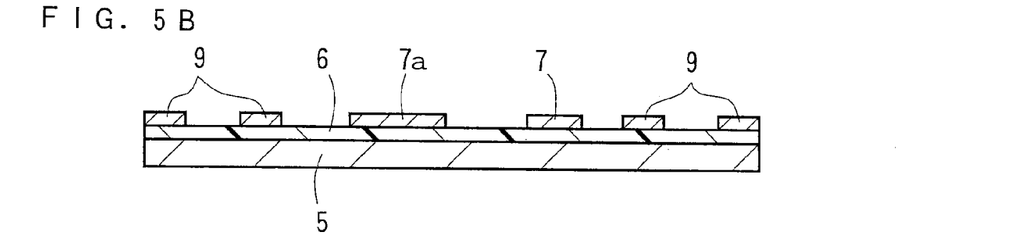

Next, as shown in FIG. 5B, a semi-additive process is performed to form the electric circuit 7 including the pads 7a for the mounting of the optical element 11, and the circuits 9 for the positioning of the through holes 8 (with reference to FIG. 5D) at the same time on the surface of the above-mentioned insulation layer 6. This forms the above-mentioned circuits 9 for the positioning of the through holes 8 appropriately located relative to the above-mentioned pads 7a for the mounting of the optical element 11. In this embodiment, the above-mentioned electric circuit 7 is formed in a central portion of the above-mentioned rectangle, and the above-mentioned circuits 9 for the positioning of the through holes 8 are formed around portions where the through holes 8 are to be formed (the four corner portions of the above-mentioned rectangle).

The formation of the above-mentioned electric circuit 7 and the circuits 9 for the positioning of the through holes 8 by the above-mentioned semi-additive process is achieved, for example, in a manner to be described below. A metal layer (having a thickness on the order of 600 to 2600 Å) is initially formed on the surface of the above-mentioned insulation layer 6 by sputtering, electroless plating or the like. This metal layer becomes a seed layer (a layer serving as a basis material for the formation of an electroplated layer) for a subsequent electroplating process. Then, a dry film resist is affixed to the opposite surfaces of a laminate comprised of the above-mentioned stainless steel substrate 5, the insulation layer 6, and the seed layer. Thereafter, groove portions having the pattern of the above-mentioned electric circuit 7 and the circuits 9 for the positioning of the through holes 8 are formed at the same time by a photolithographic process in the dry film resist on the side where the above-mentioned seed layer is formed, so that surface portions of the above-mentioned seed layer are uncovered at the bottoms of the groove portions. Next, electroplating is performed to form an electroplated layer (having a thickness on the order of 5 to 20 μm) in a stacked manner on the surface portions of the above-mentioned seed layer uncovered at the bottoms of the above-mentioned groove portions. Then, the above-mentioned dry film resist is stripped away using an aqueous sodium hydroxide solution and the like. Thereafter, a seed layer portion on which the above-mentioned electroplated layer is not formed is removed by soft etching, so that a laminate portion comprised of the remaining electroplated layer and the underlying seed layer is formed into the electric circuit 7 and the circuits 9 for the positioning of the through holes 8.

The resultant structure is set in an exposure machine, and images of the front surface (on the electric circuit 7 side) and the back surface (on the stainless steel substrate 5 side) thereof are taken with a camera. Based on the images, the positions of the portions where the through holes 8 are to be formed in the above-mentioned stainless steel substrate 5 are appropriately determined by using the above-mentioned circuits 9 for the positioning of the through holes 8 as a guide. Then, portions other than the portions where the through holes 8 are to be formed are covered with a dry film resist.

Figure 5C:
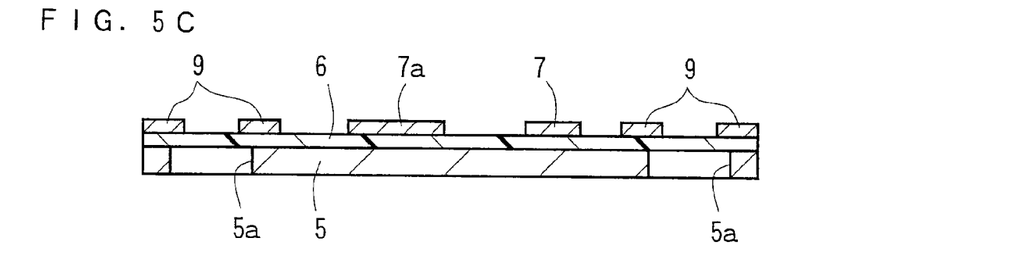
Figure 5D:
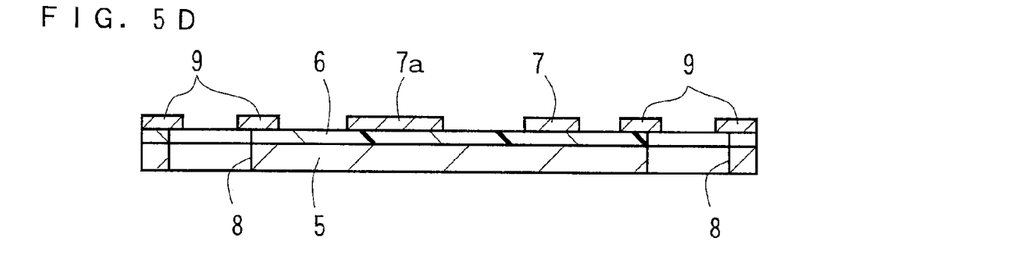

Next, as shown in FIG. 5D, uncovered portions of the stainless steel substrate 5 corresponding to the portions where the through holes 8 are to be formed are etched away by using an aqueous ferric chloride solution. Thus, portions of the above-mentioned insulation layer 6 are uncovered at removed portions 5a, as shown in FIG. 5C.

Next, as shown in FIG. 5D, the above-mentioned uncovered portions of the insulation layer 6 are etched away by using a chemical etchant. This forms the through holes 8 in the portions where the through holes 8 are to be formed. The through holes 8 are formed by using as a reference the circuits 9 for the positioning of the through holes 8 which are formed at the same time as the pads 7a for the mounting of the optical element 11 by the above-mentioned semi-additive process. Thus, the above-mentioned through holes 8 are automatically located and formed in a predetermined appropriate position relative to the above-mentioned pads 7a for the mounting of the optical element 11.

Figure 5E:
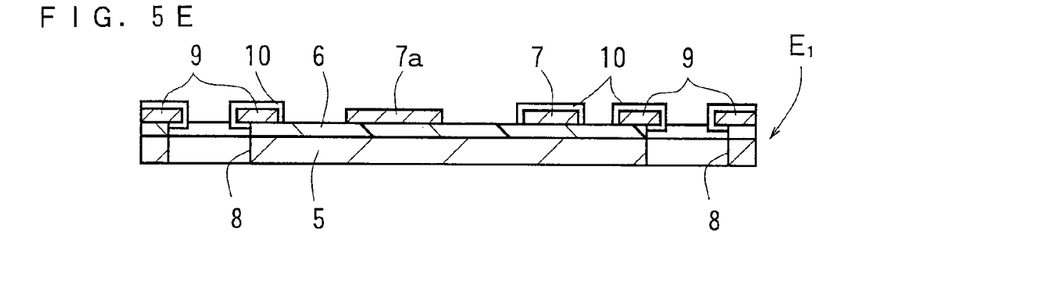

Then, the above-mentioned pads 7a for the mounting of the optical element 11 are covered with a resist, and are subjected to an electroplating process for mounting. This forms the plated layer 10 on the surface of the electric circuit 7 except the above-mentioned pads 7a for the mounting of the optical element 11 and on the surfaces of the circuits 9 for the positioning of the through holes 8, as shown in FIG. 5E. Components of this plated layer 10 include gold, nickel, and the like. The thickness of the plated layer 10 is typically in the range of 0.2 to 0.5 μm. Thereafter, the resist that covers the above-mentioned pads 7a for the mounting of the optical element 11 is removed by washing away using an alkaline solution. In this manner, the above-mentioned step (2) of producing the electric circuit portion $E_1$ is completed.

Next, the above-mentioned step (3) of mounting the optical element 11 and performing the inspection will be described. First, a silver paste (not shown) is applied to the surfaces of the pads 7a in the above-mentioned electric circuit portion $E_1$ for the mounting of the optical element 11. Thereafter, as shown in FIG. 6A, a high-precision die bonder (mounting apparatus) is used to mount the above-mentioned optical element 11 onto the above-mentioned silver paste. At this time, the electrode (cathode) provided on the lower surface of the optical element 11 is brought into contact with the above-mentioned silver paste. Thereafter, a curing process is performed to harden the above-mentioned silver paste. Then, a wire bonder (connecting apparatus) is used to electrically connect the electrode (anode) provided on the upper surface of the above-mentioned optical element 11 and the second bonding pad of the above-mentioned electric circuit 7 to each other with the bonding wire 12. Thereafter, as shown in FIG. 6B, the above-mentioned optical element 11 and its surrounding portion are sealed with the transparent resin 13 by potting. In this manner, the step of mounting the optical element 11 is completed. In the electric circuit portion $E_1$ with this optical element 11 mounted thereon, the through holes 8 formed in the step shown in FIG. 5D are located in the predetermined appropriate position relative to the above-mentioned pads 7a for the mounting of the optical element 11, as mentioned earlier. Accordingly, the optical element 11 mounted on the pads 7a for the mounting of the optical element 11 and the above-mentioned through holes 8 are in a predetermined appropriate positional relationship.

Then, a burn-in process [the process of subjecting the electric circuit portion $E_1$ to harsher conditions (for example, high temperature and high voltage) than normal use conditions] is performed on the electric circuit portion $E_1$ with the above-mentioned optical element 11 mounted thereon. Thereafter, the inspection is performed to verify the mounting state of the above-mentioned optical element 11. In this inspection, when the above-mentioned optical element 11 is a light-emitting element, current is fed through the electric circuit 7 of the electric circuit portion $E_1$, and a check is made to see whether light is emitted from the light-emitting element or not. The electric circuit portion $E_1$ with the optical element mounted thereon, in which light emission is seen is judged to be an accepted product. The electric circuit portion $E_1$ with the optical element mounted thereon, in which light emission is not seen is judged to be a reject. On the other hand, when the above-mentioned optical element 11 is a light-receiving element, the light-receiving element is exposed to light, and a check is made to see whether an electric signal is sent from the light-receiving element to the electric circuit 7 or not. The electric circuit portion $E_1$ with the optical element mounted thereon, in which this electric signal is detected is judged to be an accepted product. The electric circuit portion $E_1$ with the optical element mounted thereon, in which the above-mentioned electric signal is not detected is judged to be a reject. In this manner, the above-mentioned step (3) of performing the inspection of the optical element 11 is completed.

Next, the above-mentioned step (4) of assembling will be described. First, the electric circuit portion $E_1$ with the optical element 11 mounted thereon judged to be an accepted product in the above-mentioned step (3) of performing the inspection is located, as shown in FIG. 7, with the surface thereof on which the above-mentioned optical element 11 is mounted being positioned to face toward the core 2 of the optical waveguide portion $W_1$ (downward as seen in FIG. 7). Then, the through holes 8 in the above-mentioned electric circuit portion $E_1$ are brought into fitting engagement with the protrusions 4 in the above-mentioned optical waveguide portion $W_1$ for the positioning of the electric circuit portion $E_3$, whereby the above-mentioned optical waveguide portion $W_1$ and the electric circuit portion $E_1$ are integrated together. In this case, the fitting engagement portions of the above-mentioned protrusions 4 and the through holes 8 may be further fixed with an adhesive. In this manner, the intended opto-electric hybrid module (with reference to FIGS. 1A and 1B) is completed.

In the above-mentioned optical waveguide portion $W_1$, as mentioned earlier, the end surface provided in the first end portion of the core 2 and the protrusions 4 for the positioning of the electric circuit portion $E_1$ are in an appropriate positional relationship. In the electric circuit portion $E_1$ with the above-mentioned optical element 11 mounted thereon, the optical element 11 and the through holes 8 for fitting engagement with the above-mentioned protrusions 4 are also in an appropriate positional relationship. As a result, in the above-mentioned opto-electric hybrid module provided by bringing the above-mentioned through holes 8 into fitting engagement with the above-mentioned protrusions 4, the end surface provided in the first end portion of the core 2 and the optical element 11 are automatically placed in an appropriate positional relationship. This achieves the appropriate propagation of light.

In such a method of manufacturing the opto-electric hybrid module, the inspection may be performed to verify the mounting state of the optical element 11 mounted on the electric circuit portion $E_1$ prior to the completion of the opto-electric hybrid module. This prevents the electric circuit portion $E_1$ with the optical element 11 mounted thereon judged to be a reject as a result of the above-mentioned inspection from being assembled to the optical waveguide portion $W_1$ and hence causing the entire opto-electric hybrid module (a completed product) to become a defective.

Figure 8A:
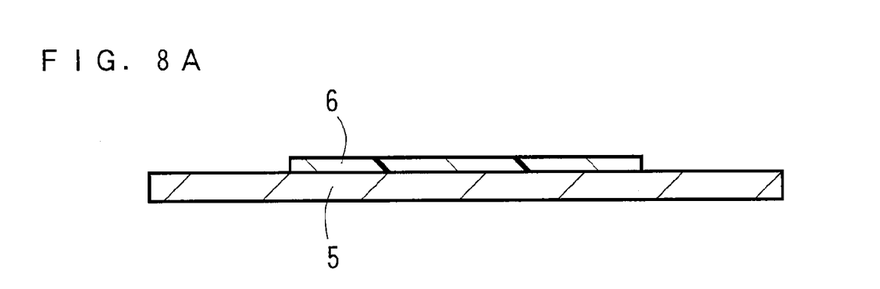
FIGS. 8A to 8D are illustrations schematically showing another step of producing the above-mentioned electric circuit portion.
Figure 8B:
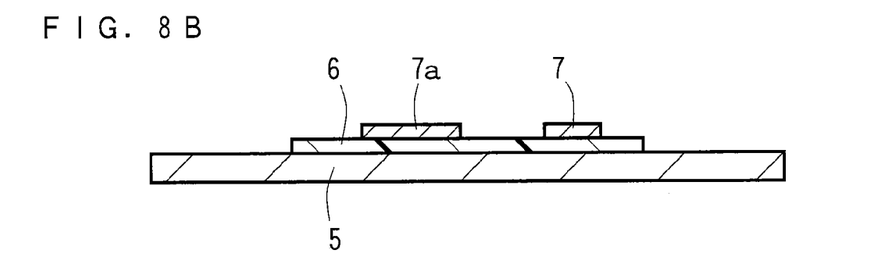
Figure 8C:
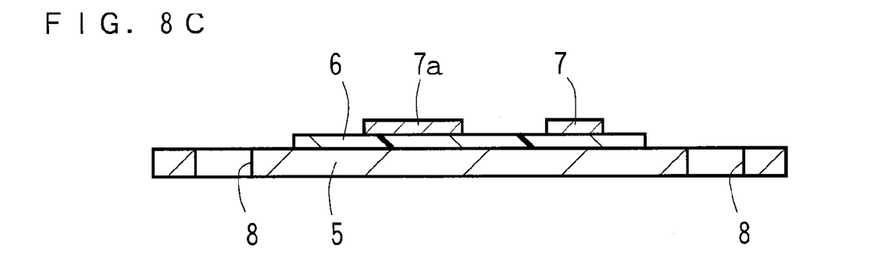
Figure 8D:
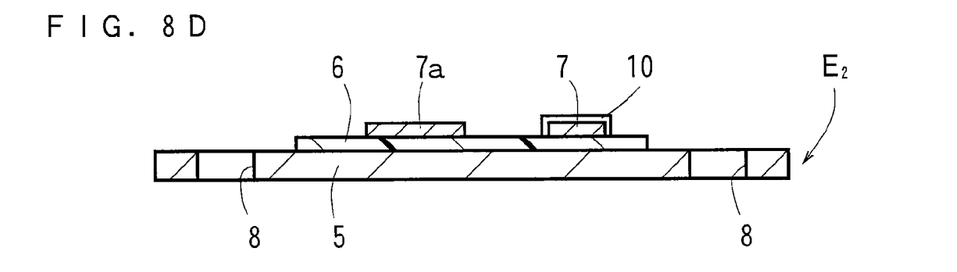

For the production of the electric circuit portion $E_1$ in the above-mentioned embodiment, the circuits 9 for the positioning of the through holes 8 are formed around the portions where the through holes 8 are to be formed. Instead, an electric circuit portion $E_2$ (with reference to FIG. 8D) may be produced without forming these circuits 9. A method of producing this electric circuit portion $E_2$ is as follows. First, as shown in FIG. 8A, the insulation layer 6 is formed by a photolithographic process on the surface of the above-mentioned stainless steel substrate 5 except where the through holes 8 (with reference to FIG. 8C) are to be formed. Then, as shown in FIG. 8B, a semi-additive process is performed in a manner similar to that of the above-mentioned embodiment to form the electric circuit 7 including the pads 7a for the mounting of the optical element 11 on the surface of the above-mentioned insulation layer 6. Then, a dry film resist is affixed to the opposite surfaces of a laminate comprised of the above-mentioned stainless steel substrate 5, the insulation layer 6, and the electric circuit 7. Thereafter, hole portions having the pattern of the portions where the through holes 8 are to be formed are formed by a photolithographic process in the dry film resist on one side by using the above-mentioned pads 7a for the mounting of the optical element 11 as a reference, so that surface portions of the above-mentioned stainless steel substrate 5 are uncovered at the bottoms of the hole portions. Next, as shown in FIG. 8C, the portions of the above-mentioned stainless steel substrate 5 uncovered at the bottoms of the above-mentioned hole portions are etched away by using an aqueous ferric chloride solution. This forms the through holes 8 in the portions where the through holes 8 are to be formed. Thereafter, as shown in FIG. 8D, an electroplating process for mounting is performed in a manner similar to that of the above-mentioned embodiment to form the plated layer 10 on the surface of the electric circuit 7 except the above-mentioned pads 7a for the mounting of the optical element 11. In this manner, the above-mentioned electric circuit portion $E_2$ may be produced. In this case, the shortening of the manufacturing steps is achieved.

Figure 9:
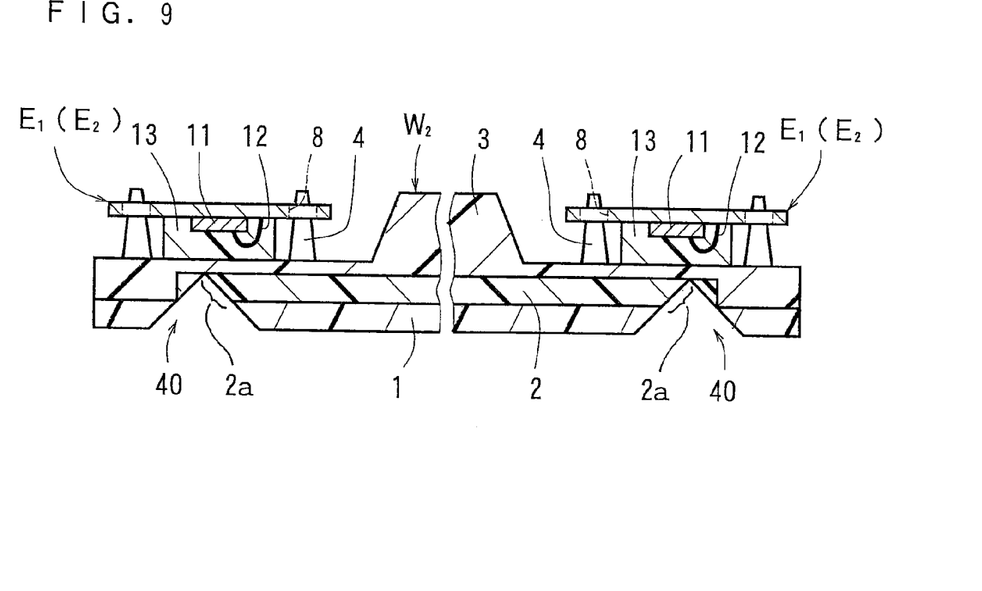
FIG. 9 is a sectional view schematically showing the opto-electric hybrid module according to another embodiment of the present invention.

In the above-mentioned embodiment, as shown in FIGS. 1A and 1B, the second end portion (the left-hand end portion as see in the figures) of the over cladding layer 3 is formed as the lens portion 3b. Instead, as shown in FIG. 9, an optical waveguide portion $W_2$ may be produced by forming the second end portions of the core 2 and the over cladding layer 3 in a similar manner to the first end portions thereof, and the electric circuit portion $E_1$ or $E_2$ with the optical element 11 mounted thereon may be assembled to the second end portions in a manner similar to that of the above-mentioned embodiment. In this case, the optical element 11 on the first end side is formed as a light-emitting element, and the optical element 11 on the second end side is formed as a light-receiving element, so that light from the light-emitting element is received by the light-receiving element through the core 2.

For the die-molding of the over cladding layer 3 and the protrusions 4 for the positioning of the electric circuit portions $E_1$ and $E_2$ in the above-mentioned embodiment, the molding die 30 is set, and thereafter the photosensitive resin is injected into the mold space 33. Instead, the die-molding may be accomplished by press molding using the above-mentioned molding die 30. Specifically, a photosensitive resin layer having a region where the over cladding layer 3 is to be formed and a region where the protrusions 4 for the positioning of the electric circuit portions $E_1$ and $E_2$ are to be formed is formed so as to cover the core 2. The above-mentioned molding die 30 is pressed against the photosensitive resin layer. In that state, exposure to irradiation light such as ultraviolet light and the like, and a heating treatment may be performed through the above-mentioned molding die 30.

In the step of producing the electric circuit portions $E_1$ and $E_2$ in the above-mentioned embodiment, the plated layer 10 is formed on the surface of the electric circuit 7 except the pads 7a for the mounting of the optical element 11 and on the surfaces of the circuits 9 for the positioning of the through holes 8. However, this plated layer 10 is formed when necessary. The plated layer 10 need not be formed when not necessary.

In the above-mentioned embodiment, the stainless steel substrate 5 is used for the production of the electric circuit portions $E_1$ and $E_2$. Instead, the substrate 5 made of other metal materials, resin materials or the like may be used. When the substrate 5 has insulating properties, the electric circuit 7 may be formed directly on the above-mentioned substrate 5 without the formation of the insulation layer 6. The above-mentioned insulation layer 6 is provided only for the purpose of preventing a short circuit from occurring between the substrate 5 having electrical conductivity such as the above-mentioned metal substrate 5 and the electric circuit 7.

Also, the element of a wire bonding type is used as the optical element 11 in the above-mentioned embodiment. Instead, an element of a flip-chip type may be used as the optical element 11.

Next, examples of the present invention will be described. The present invention is not limited to the examples.

Example 1

Material for Formation of Under Cladding Layer, Over Cladding Layer and Protrusions for Positioning of Electric Circuit Portion A material for formation of an under cladding layer, an over cladding layer, and protrusions for the positioning of an electric circuit portion is prepared by mixing 35 parts by weight of bisphenoxyethanol fluorene glycidyl ether (component A), 40 parts by weight of 3',4'-epoxycyclohexyl methyl-3,4-epoxycyclohexane carboxylate which was an alicyclic epoxy resin (CELLOXIDE 2021P manufactured by Daicel Chemical Industries, Ltd.) (component B), 25 parts by weight of (3'4'-epoxycyclohexane)methyl-3',4'-epoxycyclohexyl-carboxylate (CELLOXIDE 2081 manufactured by Daicel Chemical Industries, Ltd.) (component C), and 2 parts by weight of a 50% by weight propione carbonate solution of 4,4'-bis[di(β-hydroxyethoxy)phenylsulfinio]phenyl-sulfide-bis-hexafluoroantimonate (component D).

[Material for Formation of Core]

A material for formation of a core was prepared by dissolving 70 parts by weight of the aforementioned component A, 30 parts by weight of 1,3,3-tris{4-[2-(3-oxetanyl)]butoxyphenyl}butane and one part by weight of the aforementioned component D in ethyl lactate.

Production of Optical Waveguide Portion

The material for the formation of the above-mentioned under cladding layer was applied to a surface of a polyethylene terephthalate (PET) film (having a thickness of 188 μm) with an applicator. Thereafter, exposure by the use of irradiation with ultraviolet light (having a wavelength of 365 nm) at 2000 mJ/cm² was performed, to thereby form the under cladding layer (having a thickness of 25 μm) (with reference to FIG. 3A).

Then, the material for the formation of the above-mentioned core was applied to a surface of the above-mentioned under cladding layer with an applicator. Thereafter, a drying process was performed at 100° C. for 15 minutes to form a photosensitive resin layer (with reference to FIG. 3B). Next, a synthetic quartz chrome mask (photomask) formed with an opening pattern identical in shape with the pattern of the core was placed over the photosensitive resin layer. Then, exposure by the use of irradiation with ultraviolet light (having a wavelength of 365 nm) at 4000 mJ/cm² was performed by a proximity exposure method from over the mask. Thereafter, a heating treatment was performed at 80° C. for 15 minutes. Next, development was carried out using an aqueous solution of γ-butyrolactone to dissolve away unexposed portions. Thereafter, a heating treatment was performed at 120° C. for 30 minutes to form the core (having a thickness of 50 μm and a width of 50 μm) (with reference to FIG. 3C).

Next, a molding die made of quartz for the die-molding of the over cladding layer and the protrusions for the positioning of the electric circuit portion at the same time was set in a predetermined appropriate position by using a first end surface of the core as a reference (with reference to FIG. 4A). Then, the material for the formation of the above-mentioned over cladding layer and the protrusions for the positioning of the electric circuit portion was injected into a mold space. Thereafter, exposure by the use of irradiation with ultraviolet light at 2000 mJ/cm² was performed through the molding die. Subsequently, a heating treatment was performed at 120° C. for 15 minutes. Thereafter, the molding die was removed. This provided the over cladding layer, and the four protrusions for the positioning of the electric circuit portion (with reference to FIG. 4B). The above-mentioned over cladding layer was formed to have a thin portion on a first end side thereof and a thick portion on a second end side thereof. The thickness of the thin portion (the thickness as measured from the surface of the under cladding layer) was 90 μm when measured with a contact-type film thickness meter, and the thickness of the thick portion was 1000 μm. Each of the above-mentioned protrusions was formed in a frusto-conical shape having a height of 800 μm when measured with an electron microscope, a lower base with a diameter of 2000 μm, and an upper base with a diameter of 1000 μm.

Then, the above-mentioned PET film was stripped from the back surface of the under cladding layer. Thereafter, a dicing blade including a V-shaped edge having an included angle of 90 degrees was used to cut a first end portion of the core from the back surface side of the under cladding layer, thereby causing the first end portion of the core to be formed into a light reflecting surface inclined at 45 degrees. The light reflecting surface was formed under a light-emitting portion of a light-emitting element to be mounted in a later step (with reference to FIG. 4C). In this manner, an optical waveguide portion was produced.

Production of Electric Circuit Portion

An insulation layer (having a thickness of 10 μm) made of a photosensitive polyimide resin was formed on the entire surface of a stainless steel substrate [25 mm×30 mm×35 μm (thick)] (with reference to FIG. 5A). Then, a semi-additive process was performed to form an electric circuit including pads for the mounting of the optical element, and circuits for the positioning of through holes on a surface of the above-mentioned insulation layer, the electric circuit being formed by lamination of a seed layer made of copper/nickel/chromium alloy, and an electro copper plated layer (having a thickness of 10 μm) (with reference to FIG. 5B).

Then, an exposure machine was used to locate portions of the stainless steel substrate corresponding to future through hole portions by using the above-mentioned circuits for the positioning of the through holes as a reference. Then, portions other than the future through hole portions were covered with a dry, film resist. Thereafter, uncovered portions of the stainless steel substrate corresponding to the future through hole portions were etched away by using an aqueous ferric chloride solution (with reference to FIG. 5C). Then, the above-mentioned insulation layer portions uncovered at the removed portions were etched away by using a chemical etchant for polyimide etching. This formed the through holes (with reference to FIG. 5D).

Thereafter, the above-mentioned pads for the mounting of the optical element were covered with a resist, and were subjected to an electroplating process for mounting. This formed a plated layer (having a thickness of 0.5 μm) on the surface of the electric circuit except the above-mentioned pads for the mounting of the optical element and on the surfaces of the circuits for the positioning of the through holes, the plated layer being comprised of two layers: a plated layer made of gold, and a plated layer made of nickel (with reference to FIG. 5E). In this manner, the electric circuit portion was produced.

Mounting of Light-Emitting Element

A silver paste was applied to the surfaces of the pads for the mounting of the optical element. Thereafter, a high-precision die bonder (mounting apparatus) was used to mount a light-emitting element of a wire bonding type (SM85-1N001 manufactured by Optowell Co., Ltd.) onto the above-mentioned silver paste. At this time, an electrode (cathode) provided on the back surface of the light-emitting element was brought into contact with the above-mentioned silver paste. Thereafter, a curing process was performed to harden the above-mentioned silver paste. Then, a wire bonder (connecting apparatus) was used to electrically connect an electrode (anode) provided on the front surface of the above-mentioned light-emitting element and a second bonding pad of the above-mentioned electric circuit to each other with a bonding wire (with reference to FIG. 6A). Thereafter, the above-mentioned light-emitting element and its surrounding portion were sealed with a transparent resin (NT-8038 manufactured by Nitto Denko Corporation) by potting (with reference to FIG. 6B). In this manner, the light-emitting element was mounted on the above-mentioned electric circuit portion.

Mounting Inspection of Light-Emitting Element

A burn-in process was performed on the electric circuit portion with the above-mentioned optical element mounted thereon. Thereafter, a constant-current source was used to feed current through the electric circuit of the above-mentioned electric circuit portion, and a check was made to see whether light was emitted from the light-emitting element or not. The electric circuit portion with the light-emitting element mounted thereon in which light emission was seen was judged to be an accepted product. The electric circuit portion with the light-emitting element mounted thereon in which light emission was not seen was judged to be a reject.

Manufacture of Opto-Electric Hybrid Module

The electric circuit portion with the light-emitting element mounted thereon judged to be an accepted product as a result of the above-mentioned inspection was assembled to a first end portion of the optical waveguide portion. Specifically, the through holes in the above-mentioned electric circuit portion were brought into fitting engagement with the protrusions in the above-mentioned optical waveguide portion for the positioning of the electric circuit portion. Thereafter, the fitting engagement portions of the protrusions and the through holes were fixed with an adhesive. In this manner, an opto-electric hybrid module was manufactured (with reference to FIGS. 1A and 1B).

Example 2

The electric circuit portion in Example 1 described above was produced in a manner to be described below. Except for this, a process similar to that in Example 1 described above was performed to produce an opto-electric hybrid module.

Production of Electric Circuit Portion

An insulation layer (having a thickness of 10 μm) was formed by a photolithographic process on the surface of the above-mentioned stainless steel substrate except the future through hole portions (with reference to FIG. 8A). Then, an electric circuit including pads for the mounting of the optical element was formed on the surface of the above-mentioned insulation layer in a manner similar to that in Example 1 described above, the electric circuit being formed by lamination of a seed layer made of copper/nickel/chromium alloy, and an electro copper plated layer (having a thickness of 10 μm) (with reference to FIG. 8B).

Then, a dry film resist was affixed to the opposite surfaces of a laminate comprised of the above-mentioned stainless steel substrate, the insulation layer, and the electric circuit. Thereafter, hole portions having the pattern of the above-mentioned future through hole portions were formed by a photolithographic process in the dry film resist on one side, so that surface portions of the above-mentioned stainless steel substrate were uncovered at the bottoms of the hole portions. Next, the portions of the above-mentioned stainless steel substrate uncovered at the bottoms of the above-mentioned hole portions were etched away by using an aqueous ferric chloride solution. This formed through holes in the above-mentioned future through hole portions (with reference to FIG. 8C). Thereafter, an electroplating process for mounting was performed in a manner similar to that in Example 1 described above to form a plated layer (having a thickness of 0.5 μm) on the surface of the electric circuit except the above-mentioned pads for the mounting of the optical element, the plated layer being comprised of two layers: a plated layer made of gold, and a plated layer made of nickel (with reference to FIG. 8D). In this manner, the electric circuit portion was produced.

Light Propagation Test

Current was fed through the light-emitting element of the opto-electric hybrid module in Examples 1 and 2 described above to cause the light-emitting element to emit light. Then, the emission of light from an end portion of the opto-electric hybrid module was seen.

This result shows that the opto-electric hybrid module obtained by the above-mentioned manufacturing method propagate light appropriately. Also, in the above-mentioned manufacturing method, the inspection was performed to verify the mounting state of the optical element mounted on the electric circuit portion prior to the completion of the opto-electric hybrid module. This prevented the electric circuit portion with the optical element mounted thereon judged to be a reject as a result of the inspection from being assembled to the optical waveguide portion and hence causing the entire opto-electric hybrid module (a completed product) to become a defective.

The opto-electric hybrid module according to the present invention may be used for detection means for detecting a finger touch position and the like on a touch panel, or information communications equipment and signal processors for transmitting and processing digital signals representing sound, images and the like at high speeds.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A method of manufacturing an opto-electric hybrid module, comprising the steps of:
   (a) producing an optical waveguide portion;
   (b) producing an electric circuit portion;
   (c) mounting an optical element onto the electric circuit portion;
   (d) performing an inspection to verify the mounting state of the optical element; and
   (e) integrating the electric circuit portion with the optical element mounted thereon and the optical waveguide portion with each other into the opto-electric hybrid module, when the appropriate mounting of the optical element is verified as a result of the inspection performed in said step (d),
   said step (a) including the steps of
   (a-1) preparing an under cladding layer,
   (a-2) forming a linear core for an optical path on a surface of the under cladding layer, and
   (a-3) then forming protrusions for the positioning of the electric circuit portion in a predetermined appropriate position by a die-molding process at the same time as forming an over cladding layer for covering the core,
   said step (b) including the steps of
   (b-1) forming an electric circuit including pads for the mounting of the optical element on a substrate, and
   (b-2) forming through holes for fitting engagement with the protrusions,
   the optical element being mounted on the pads in the electric circuit portion in said step (c),
   the integration in said step (e) being achieved by bringing the through holes in the electric circuit portion into fitting engagement with the protrusions in the optical waveguide portion.

2. The method of manufacturing the opto-electric hybrid module according to claim 1, wherein the protrusions for the positioning of said electric circuit portion are located in an appropriate position relative to an end portion of said core, and the through holes for fitting engagement with the protrusions are located in an appropriate position relative to the pads for the mounting of the optical element.

3. The method of manufacturing the opto-electric hybrid module according to claim 1,
   wherein the substrate of said electric circuit portion is made of metal, and
   wherein the step of producing said electric circuit portion comprises the steps of:
   forming an insulation layer on a surface of the metal substrate, and then forming circuits for the positioning of the through holes around future through hole portions where said through holes are to be formed at the same time as forming the electric circuit including the pads for the mounting of said optical element;
   etching away portions of said metal substrate corresponding to said future through hole portions and etching away portions of the insulation layer corresponding to said future through hole portions by using the circuits for the positioning of the through holes as a reference, to thereby form said through holes; and
   performing a plating process for mounting on surfaces of the electric circuit except the pads for the mounting of said optical element and the circuits for the positioning of the through holes.

* * * * *